(12) United States Patent
Benwadih

(10) Patent No.: US 8,048,712 B2
(45) Date of Patent: Nov. 1, 2011

(54) METHOD FOR PRODUCING LOCALIZED PATTERNS

(75) Inventor: Mohamed Benwadih, Champigny-sur-Marne (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 12/879,473

(22) Filed: Sep. 10, 2010

(65) Prior Publication Data

US 2011/0076797 A1    Mar. 31, 2011

(30) Foreign Application Priority Data

Sep. 30, 2009    (FR) ...................................... 09 04666

(51) Int. Cl.
*H01L 51/40* (2006.01)
(52) U.S. Cl. ......................................................... 438/99
(58) Field of Classification Search .................... 438/99, 438/107, 725, 942; 427/256, 457, 259
See application file for complete search history.

(56) References Cited

U.S. PATENT DOCUMENTS

| | | | |
|---|---|---|---|
| 2004/0082183 A1* | 4/2004 | Mori | ............................ 438/704 |
| 2005/0112294 A1 | 5/2005 | Masuda et al. | |
| 2006/0057293 A1* | 3/2006 | Sharma et al. | ............. 427/372.2 |
| 2007/0232035 A1 | 10/2007 | Ramsdale et al. | |

FOREIGN PATENT DOCUMENTS

WO    WO 2005/112146 A1    11/2005

OTHER PUBLICATIONS

Schaffer et al., "Thermomechanical Lithography: Patern Replication Using a Temperature Gradient Driven Instability," Advanced Materials, Mar. 17, 2003, pp. 514-517, vol. 15-No. 6.

* cited by examiner

*Primary Examiner* — Ha Tran T Nguyen
*Assistant Examiner* — Shaun Campbell
(74) *Attorney, Agent, or Firm* — Oliff & Berridge, PLC

(57) ABSTRACT

A method for producing at least one pattern on a top surface of a support made from a material presenting a first thermal conductivity comprises a step of arranging of a mask made from a material presenting a second thermal conductivity and comprising at least one recess having a shape corresponding to that of the pattern, in contact with a bottom surface of the support, the ratio of the first conductivity over the second conductivity being greater than or equal to 2, or smaller than or equal to ½, throughout the duration of the method. The method further comprises a step of depositing on the top surface a solution comprising a material designed to form the pattern, and a step of evaporating the solution.

12 Claims, 2 Drawing Sheets

METHOD FOR PRODUCING LOCALIZED PATTERNS

BACKGROUND OF THE INVENTION

The invention relates to a method for producing at least one pattern on a top surface of a support.

STATE OF THE ART

The layer patterning techniques used at the present time are for example photolithography and etching or deposition through a mask by means of the stencil technique. These microelectronics techniques are costly and unsuitable for deposition of organic layers. In this case, printing techniques are preferred because they are inexpensive, easy to set up and enable large-size supports to be used.

Techniques such as offset, flexography printing, serigraphy (screen printing) and inkjet printing are commonly used for fabrication of printed electronics, with a preference for inkjet printing and screen printing.

Inkjet printing is extensively used in fabrication of organic devices, for example organic field-effect transistors or organic light-emitting diodes. This printing technique is used in particular for the deposition step of an organic semiconductor in these devices. This technique is however limited in terms of resolution. The minimum dimension obtained is in fact about 50 µm. Other printing techniques enable a lower resolution of about 20 µm to be obtained, which does however remain insufficient in certain application cases.

In order to make finer patterns on a substrate, it is possible to define lipophilic areas and lipophobic areas, or hydrophilic and hydrophobic areas, on the surface of the substrate. This therefore involves modifying the affinity of the surface of the substrate for fats or water. This step precedes deposition of a solution containing the material to be deposited. The solution, comprising for example a dissolved organic semiconductor, is then deposited and confines itself in a lipophilic or hydrophilic area.

FIG. 1 represents a transistor in thin layers obtained by a simplified patterning method, described in US Patent application US2007/0232035. The method comprises a step of deposition of a polymer layer 2 having a low surface energy on a substrate 1. Conducting electrodes (source and drain) 3a and 3b of the transistor are then realised on polymer layer 2, for example by inkjet printing or by metal deposition and photolithography. They are formed from a material having a high surface energy. Low surface energy polymer layer 2 remains free in a channel area 4, between electrodes 3a and 3b, and in an area 5 located around electrodes 3a and 3b.

A semiconductor material in solution is then deposited on electrodes 3a and 3b and on channel area 4, preferably by inkjet printing. As electrodes 3a and 3b have a higher surface energy than polymer layer 2, the solution is attracted by these surface energy differences to cover the top surfaces of source and drain electrodes 3a and 3b. The nature of the solution and the surface conditions, the wetting conditions for example, are such that the semiconductor in solution is attracted by the surface of electrodes 3a and 3b and repelled by area 5. Furthermore, despite the low surface energy of layer 2 in channel area 4, the solution remains confined in area 4.

After an evaporation step, the solution is transformed into a thin semi-conductor layer 6 covering electrodes 3a and 3b and channel area 4. In channel area 4, the thin semiconductor layer is continuous and is in contact with the side walls of electrodes 3a and 3b. The channel is thereby formed.

For the solution to remain confined in area 4, the surface energy of the solution can be increased or the evaporation time be reduced.

Substrate 1 can be rigid, for example made from glass, or flexible, made in particular from polyethylene naphthalate (PEN) or polyethylene teraphthalate (PET).

This method therefore enables self-aligned confinement of a semiconductor island forming a channel between the source and drain electrodes. However, the semiconductor used by this method is not in crystalline form and is often unsuitable for inkjet deposition methods. Furthermore, the spatial resolution of the obtained patterns is limited by the size of the droplets and by the spreading of the liquid.

OBJECT OF THE INVENTION

The object of the invention is to provide a method for producing high-resolution patterns that is simple and easy to implement.

More particularly, the object of the invention is to provide a method for producing fine patterns that is totally compatible with a large number of materials and with the usual printing techniques, in particular inkjet printing.

According to the invention, this object is achieved by the fact that the method for producing at least one pattern on a top surface of a support made from a material presenting a first thermal conductivity comprises a step of arranging a mask made from a material presenting a second thermal conductivity and comprising at least one recess having a shape corresponding to that of the pattern, in contact with a bottom surface of the support, the ratio of the first conductivity over the second conductivity being greater than or equal to 2, or smaller than or equal to ½, throughout the duration of the method. The method further comprises a step of depositing on the top surface a solution comprising a material designed to form the pattern, and a step of evaporating the solution.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PARTICULAR EMBODIMENTS

Figure 1:
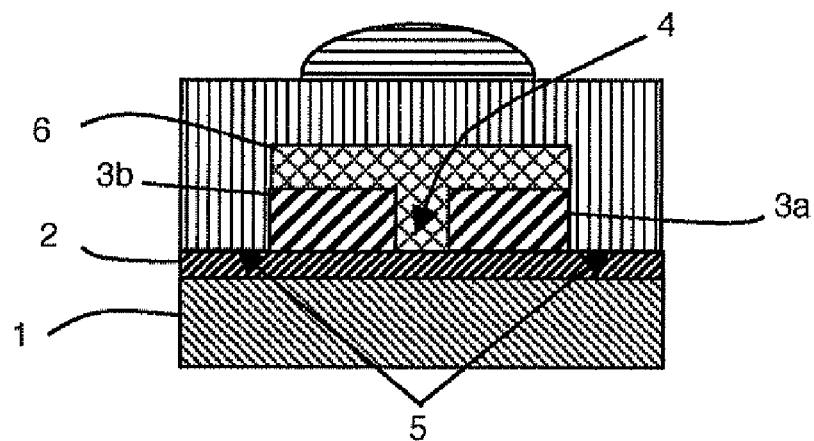
FIG. 1 represents a transistor obtained by a patterning method according to the prior art.
Figure 2:
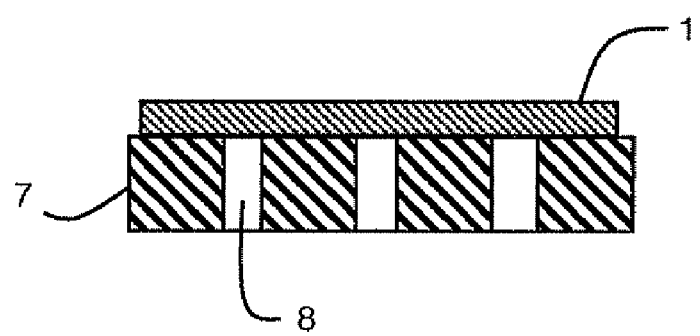
FIGS. 2 to 4 represent steps of a method for producing patterns according to the invention.

FIG. 2 represents a step of a method for producing at least one localized and structured pattern. In very simple manner, this method enables formation of patterns of small dimensions, 100 nm or less for example, on a top surface of a support 1 or substrate.

A mask 7 is arranged in contact with a bottom surface of support 1. The mask comprises at least one recess 8. In FIG. 2, three recesses 8 are represented. Each recess 8 corresponds to a pattern to be formed on the top surface of support 1. Each recess 8 thereby has a shape and size suitable for the pattern to be made. The recess is preferably pass-through, as represented in FIG. 2.

Figure 3:
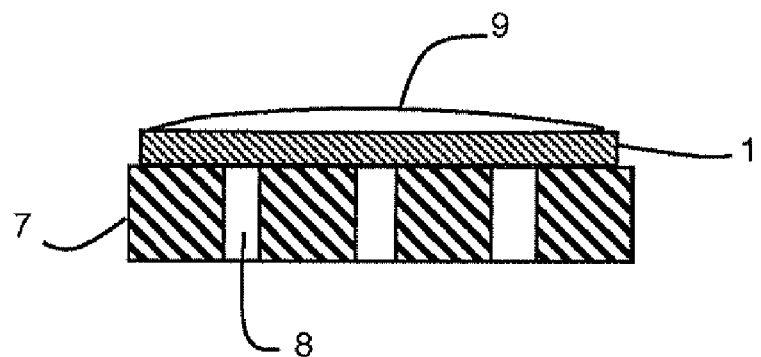

FIG. 3 represents the next step of the method corresponding to deposition on the top surface of support 1 of a solution 9 comprising a material designed to form the patterns. Deposition of this solution can be performed by the usual printing techniques, in particular by inkjet printing. The solution covers at least one area of support 1 whereunder recesses 8 of mask 7 are arranged. The solution preferably integrally covers the top surface of support 1.

In a particular embodiment, solution 9 comprises at least one solvent in which the material to be deposited is dissolved. The material to be deposited is preferably an organic semiconductor, for example pentacene, or an organic insulator, in particular polystyrene.

The material to be deposited can also be formed by nanoparticles dispersed in a liquid. In this case, the solvent is replaced by a dispersant, for example water, Zonyl® of the DuPont™ trademark or a soap. The nanoparticles can be in the form of tubes, wires or spheres made from silicon, silica, metal or carbon for example.

It has been discovered that by placing the mask under the support in the manner described above and by eliminating a part of the deposited solution, the liquid layer of solution divides and forms self-aligned islands on the recesses of the mask. This separation into islands can be achieved by an evaporation step of the solution, either in natural manner or in heat-assisted manner.

Figure 4:
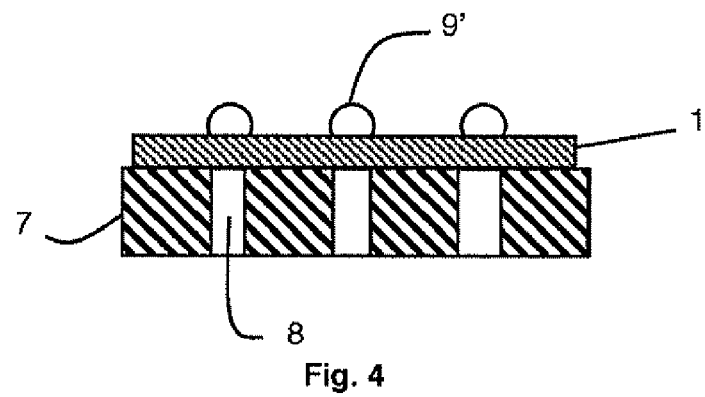

FIG. 4 represents separation of the solution into islands 9" during the evaporation step. Each island 9' is formed above a recess 8 of mask 7. This separation phenomenon could be due to the ratio of the thermal conductivities between support 1 and mask 7. Support 1 is made from a material presenting a first thermal conductivity $\lambda_1$. Mask 7 is made from a material presenting a second thermal conductivity $\lambda_2$. To obtain the separation described above, the ratio of the first thermal conductivity $\lambda_1$ over the second thermal conductivity $\lambda_2$ is greater than or equal to 2, or less than or equal to ½, ($\lambda_1/\lambda_2 \leq$ ½ or $\lambda_1/\lambda_2 \geq 2$), throughout the duration of the method. The thermal conductivity of support $\lambda_1$ is thereby either at least twice as great as the thermal conductivity of the mask $\lambda_2$, or inversely $\lambda_2$ is at least twice as great as $\lambda_1$.

In general manner, a ratio $\lambda_1/\lambda_2$, or its inverse $\lambda_2/\lambda_1$, of high value facilitates and accelerates the formation of islands 9'. The ratio of first thermal conductivity $\lambda_1$ over thermal conductivity $\lambda_2$ is therefore preferably greater than or equal to 10, or smaller than or equal to 1/10.

The support having a thickness generally comprised between 10 µm and 1 mm, the top surface of support 1 would present temperature gradients during the evaporation step of the method. The top surface of the support is thus organized in areas in which the solution evaporates more or less quickly.

Support 1 can be made from plastic or silica. The support is preferably flexible, being made from polyethylene naphthalate (PEN), polyethylene teraphthalate (PET) or polyimide for example. Mask 7 is preferably made from a material that is a good heat conductor, for example stainless steel.

The thermal conductivity depends firstly on the nature of the material chosen, but also on the temperature of the material and the electric field applied. The temperature and electric field of the mask can therefore be adjusted so as to modify its thermal conductivity during the evaporation step. This is advantageous for example when the standard thermal conductivities (conductivities for a temperature of 20° C. and a zero electric field) of the mask and support are close to one another. In this case, the ratio of the conductivities $\lambda_1/\lambda_2$ (or its inverse) is close to 1 and therefore does not fulfil the condition for formation of islands. Thus, by adjusting the temperature of the mask and the electric field applied to the mask, the desired conductivity ratio can be achieved.

The method therefore advantageously comprises application of an electric field on the mask during the evaporation step. This electric field is preferably comprised between 1V/m and 100 kV/m.

The method can also comprise heating or cooling of the mask during the evaporation step. The mask is then heated to a temperature comprised between −100° C. and +100° C.

The evaporation step of the method also enables islands 9' of solution to be transformed into patterns in the selected material.

In an alternative embodiment, recesses 8 are filled with a filling material presenting a third thermal conductivity $\lambda_3$. The ratio of the thermal conductivities between the filling material and the material forming the mask also enhances separation into islands under certain conditions. The ratio of the first conductivity $\lambda_1$ over the third conductivity $\lambda_3$ is greater than or equal to 2, or smaller than or equal to ½, throughout the duration of the method. The filling material can be chosen from air, water, an oil or any other fluid.

Another explanation of the separation phenomenon could be a modification of the surface energy of the top surface of the support. The surface energies of the solution and of the support, among others, do in fact have an influence on the wettability conditions of the solution on the support. The wettability in practice defines the ability of a liquid to spread on a solid. A liquid therefore wets when it adheres and spreads on a surface and dewets when it does not adhere on the surface.

The surface energy could be textured following application of mask 7 on the bottom surface of support 1 on account of the small thickness of the support. The areas of the top surface of the support situated above recesses 8 would therefore have a different surface energy from that of the areas situated above the material forming the mask. The liquid is then retained by the areas of the top surface of the support situated above the recesses. Application of a mask on the bottom surface of the support could therefore be a simple way of texturing the surface energy prior to deposition of a solution on the top surface of the support.

This patterning technique can be improved by modifying certain surface parameters. For example the roughness also conditions the wettability of the liquid on the support. In general manner, a high roughness makes the surface less wetting. The use of several solvents enables the evaporation parameters of the liquid to be modified.

Advantageously, the volume of the solution is reduced during the evaporation step, by blowing, scraping or momentary inclination of the support. This step in particular enhances separation of the liquid layer into islands during evaporation of the solvent or dispersant. Furthermore, it enables the excess liquid to be evacuated, i.e. the liquid that has not adhered to the support and not forming the islands. In certain cases, separation of the solution into islands can be performed totally by blowing, scraping or inclination of the support.

Figure 5:
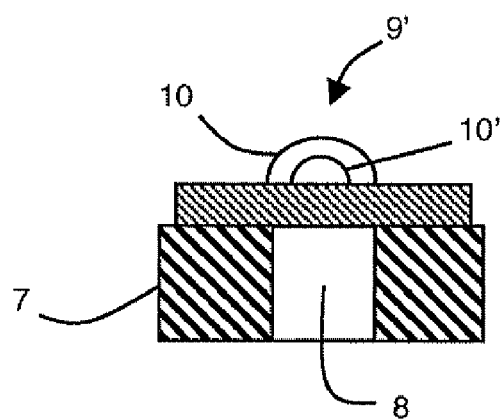
FIG. 5 represents an alternative embodiment of a method for producing patterns according to the invention.

FIG. 5 represents an alternative embodiment of the method wherein the solution used comprises at least two non-miscible solvents. The solvents are noted 10 and 10' in FIG. 5. Solvent 10 is confined to the vertical of recess 8 as described in relation to FIG. 4. Solvent 10', which contains the material to be deposited, is confined by solvent 10. In this way, solvent 10' defines a pattern of smaller dimensions than that of recess 8. The spatial resolution of the patterns is thus increased.

This method for producing patterns can be used in a large number of applications. The use of a support made from plastic is preferred and the method is perfectly suited to deposition of semiconducting or insulating organic layers. Organic transistors and light-emitting diodes are therefore privileged applications.

Figure 6:
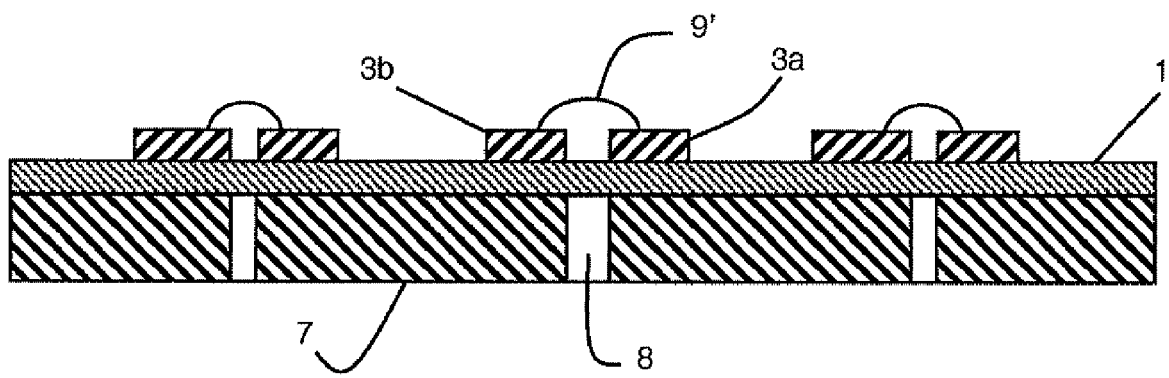
FIG. 6 represents a transistor obtained by the method according to FIGS. 2 to 4.

FIG. 6 represents for example purposes formation of Thin Film Transistor (TFT) channels in a semiconducting organic material by means of the method according to the invention.

Source and drain electrodes 3a and 3b of the transistors are made on a support 1 made from plastic, for example from PET with a thermal conductivity equal to about 0.1 W·m$^{-1}$·K$^-$. Stainless steel mask 7 (thermal conductivity of 100 W·m$^{-1}$·K$^{-1}$) is arranged under support 1 and comprises recesses 8 which can be of different sizes. Recesses 8 are filled with air. The size of each recess 8 is adapted to the dimensions required for the different channels, for example 50 μm. An organic semiconductor in solution is deposited on the whole of the top surface of the plastic support by inkjet printing. The volume of the liquid is reduced by evaporation assisted by scraping of its surface until dots 9' form above recesses 8. Mask 7 is kept at ambient temperature and no electric field is applied. The dots of solution are thus transformed into layers of organic semiconductor material forming the different channels of TFT transistors.

The invention claimed is:

1. Method for producing at least one pattern on a top surface of a support comprising steps of:
    depositing a solution comprising a solvent and a material designed to form the at least one pattern on the top surface of the support;
    arranging a mask comprising, at least one recess, in contact with a bottom surface of the support, the mask and the support being configured to pattern a surface energy of the support, wherein a surface energy of an area of the top surface of the support situated above the at least one recess of the mask is different from the surface energy of areas of the top surface of the support that are apart from the recess;
    confining the solution in the area of the top surface of the support situated immediately above the at least one recess; and
    forming the at least one pattern on the top surface of the support in the area situated above the at least one recess by evaporating the solvent.

2. The method according to claim 1, wherein said at least one pattern comprises several patterns and the solution is deposited so as to cover integrally the top surface of the support.

3. The method according to claim 1, wherein confining of the solution is achieved during the evaporating step.

4. The method according to claim 3, further comprising applying an electric field of between 1 V/m and 100 kV/m on the mask during the evaporating step.

5. The method according to claim 3, further comprising heating the mask to a temperature of between −100° C. and +100° C. during the evaporating step.

6. The method according to claim 3, wherein the recesses are filled by a filling material.

7. The method according to claim 6, wherein the filling material is chosen from air, water or an oil.

8. The method according to claim 3, wherein, during the evaporating step, the volume of the solution is reduced by scraping, blowing or inclination of the support.

9. The method according to claim 1, wherein the material designed to form the patterns is an organic semiconductor, an organic insulator or is formed by nanoparticles dispersed in a liquid.

10. The method according to claim 9, wherein the nanoparticles are in the form of tubes, wires or spheres made from silicon, metal or carbon.

11. The method according to claim 1, wherein the mask is made from stainless steel, the support is made from plastic and the recesses are filled with air.

12. Method for producing at least one pattern on a top surface of a support comprising the steps of:
    depositing a solution comprising a dispersant and a material designed to form the at least one pattern on the top surface of the support;
    arranging a mask, comprising at least one recess, in contact with a bottom surface of the support, the mask and the support being configured to pattern a surface energy of the support, wherein a surface energy of an area of the top surface of the support situated above the at least one recess of the mask is different from the surface energy of areas of the top surface of the support that are apart from the recess;
    confining the solution in the area of the top surface of the support immediately above the at least one recess; and
    forming the at least one pattern on the top surface of the support in the area immediately above the at least one recess by evaporating the dispersant.

* * * * *